United States Patent
Lee et al.

(10) Patent No.: US 10,170,517 B2
(45) Date of Patent: Jan. 1, 2019

(54) METHOD FOR FORMING IMAGE SENSOR DEVICE

(71) Applicant: Taiwan Semiconductor Manufacturing Co., Ltd., Hsin-Chu (TW)

(72) Inventors: Yueh-Chuan Lee, Hsinchu (TW); Ta-Hsin Chen, Hsin-Chu (TW); Chia-Chan Chen, Zhubei (TW); Chih-Huang Li, Hsin-Chu (TW); Ren-Jie Lin, Tainan (TW); Jung-I Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 23 days.

(21) Appl. No.: 15/489,019

(22) Filed: Apr. 17, 2017

(65) Prior Publication Data

US 2018/0301502 A1    Oct. 18, 2018

Related U.S. Application Data

(60) Provisional application No. 62/433,655, filed on Dec. 13, 2016.

(51) Int. Cl.
*H01L 27/146* (2006.01)

(52) U.S. Cl.
CPC .... *H01L 27/14687* (2013.01); *H01L 27/1463* (2013.01); *H01L 27/14643* (2013.01)

(58) Field of Classification Search
CPC ................................. H01L 27/14643
See application file for complete search history.

(56) References Cited

U.S. PATENT DOCUMENTS

| | | | | |
|---|---|---|---|---|
| 6,555,467 B2* | 4/2003 | Hsu | .................. | H01L 21/76811 257/E21.579 |
| 8,334,189 B2* | 12/2012 | Kao | .................. | H01L 21/76229 257/E21.546 |
| 2004/0092115 A1* | 5/2004 | Hsieh | .................. | H01L 21/3081 438/694 |
| 2011/0049330 A1* | 3/2011 | Adkisson | .......... | H01L 27/14625 250/208.1 |
| 2011/0189830 A1* | 8/2011 | Oshima | ................ | H01L 21/762 438/270 |
| 2012/0104540 A1* | 5/2012 | Mehrotra | ............ | H01L 21/3086 257/506 |
| 2014/0131771 A1* | 5/2014 | Flachowsky | ...... | H01L 29/66181 257/194 |

* cited by examiner

*Primary Examiner* — Mounir Amer
(74) *Attorney, Agent, or Firm* — Duane Morris LLP

(57) ABSTRACT

A method for forming an image sensor device on a substrate is disclosed. The method includes (a) recessing a portion of the substrate thereby forming a first shallow trench; (b) forming a spacer layer surrounding at least part of a sidewall of the first shallow trench; and (c) forming a first deep trench that extends below the first shallow trench by further recessing the substrate while using the spacer layer as a mask.

17 Claims, 11 Drawing Sheets

METHOD FOR FORMING IMAGE SENSOR DEVICE

CROSS-REFERENCE TO RELATED APPLICATIONS

The present application claims priority benefit of U.S. Provisional Application No. 62/433,655, filed on Dec. 13, 2016, the contents of which are incorporated by reference in its entirety.

BACKGROUND

Semiconductor image sensors are used for sensing light. Complementary metal-oxide-semiconductor (CMOS) image sensors (CIS) and charge-coupled device (CCD) sensors are typically used in various applications such as digital still camera or mobile phone camera applications. These devices utilize an array of pixels in a substrate, including photodiodes and transistors, that can absorb radiation (e.g., light) projected toward the substrate and convert the sensed radiation into electrical signals.

Back side illuminated (BSI) and front side illuminated (FSI) image sensor devices are two respective types of image sensor devices that have been actively developed over the years. As transistor device size shrinks with each technology generation, existing BSI/FSI image sensor devices may begin to suffer from cross-talk and blooming issues. In general, such issues may be due to insufficient isolation between neighboring pixels of the BSI/FSI image sensor device.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
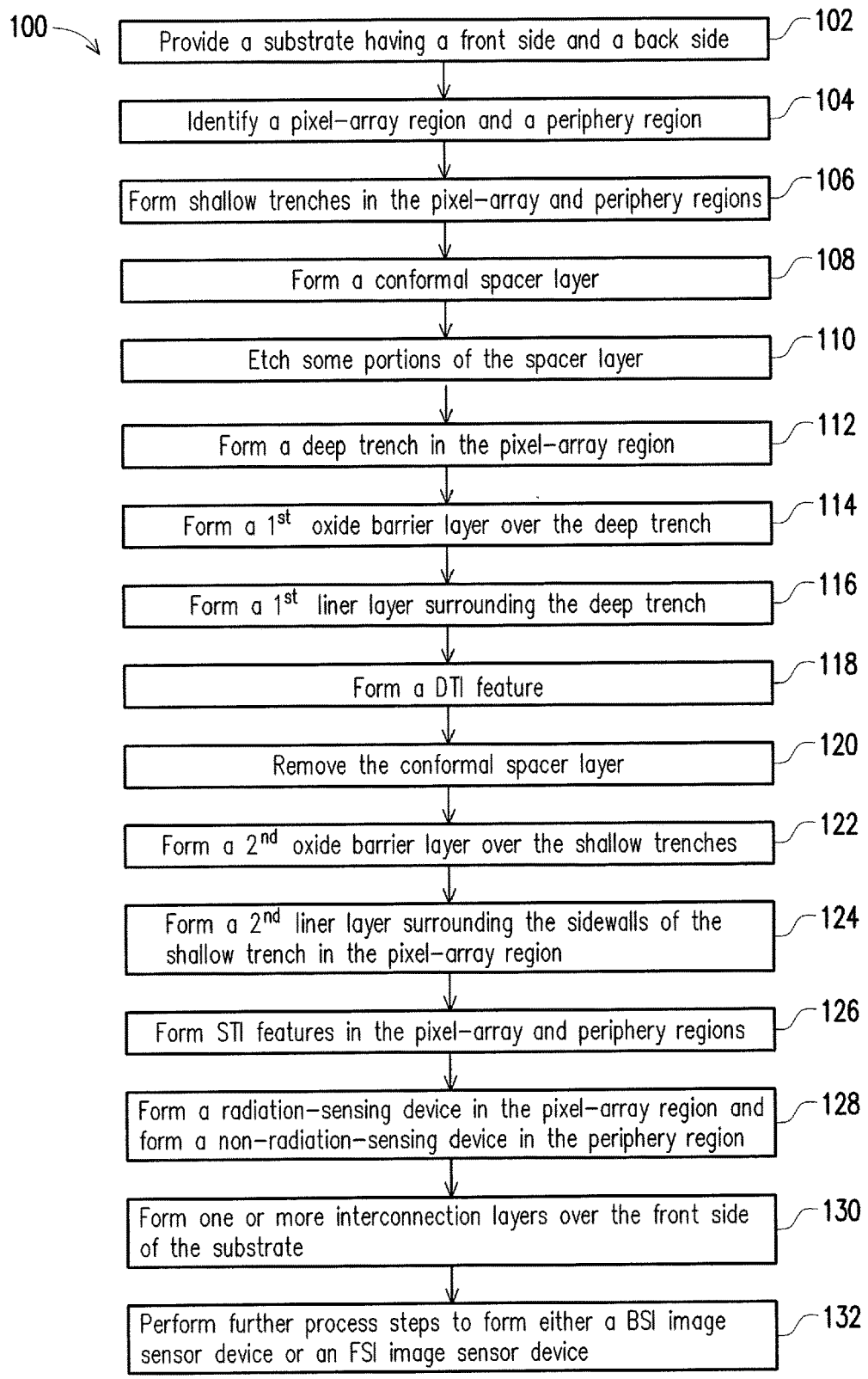
FIG. 1 illustrates a flow chart of a method to form an image sensor device, in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a complementary metal-oxide-semiconductor (CMOS) image sensor (CIS) device, including but not limited to back side illuminated (BSI) and front side illuminated (FSI) image sensor devices, uses one or more shallow trench isolation (STI) features to isolate neighboring pixels of the CIS device so as to avoid "cross-talk" between neighboring pixels. With applications of the CIS device extending to a longer wavelength region, e.g., the near-infrared (NIR) region (about 700 nanometers (nm) to 950 nm), the STI features may not be sufficient to isolate the pixels. Accordingly, a deep trench isolation (DTI) feature is proposed to be further formed in the CIS device in order to cure such a deficiency. However, to fabricate a CIS device with both STI and DTI features, various fabrication trade-offs may be made. For example, in order to align a DTI feature with an STI feature, the size of the STI feature is typically made larger (wider) to take into account an overlap margin. As such, the critical dimension (CD) of the STI feature may be increased. In turn, such an increased CD of the STI feature may disadvantageously impact overall optical performance of the CIS device.

The present disclosure provides various embodiments of methods to form an image sensor device's STI and DTI feature that are immune from the above-mentioned trade-offs. More specifically, in some embodiments, by using the disclosed method to form an image sensor device, the STI feature of the image sensor device has a CD that can be accurately defined by a respective lithography capability (e.g., resolution), and the DTI feature is self-aligned with the STI feature. Accordingly, an overlap margin may not be needed. In one embodiment, a spacer layer is formed along sidewall(s) of the STI feature as an etch-block layer while forming the DTI feature. As such, compared to the CD of the DTI feature in a conventional CIS device that is generally limited by respective lithography resolution, the CD of the DTI feature of the image sensor device according to some embodiments can be further reduced by about two times thickness of the spacer layer. As a result, the respective CD's of the DTI and STI features formed in accordance with various embodiments disclosed herein may be substantially decreased, which in turn advantageously enhances overall optical performance of the image sensor device, e.g., a wider dynamic range, a higher quantum efficiency, a lower photo response non-uniformity, etc.

Figure 2A:
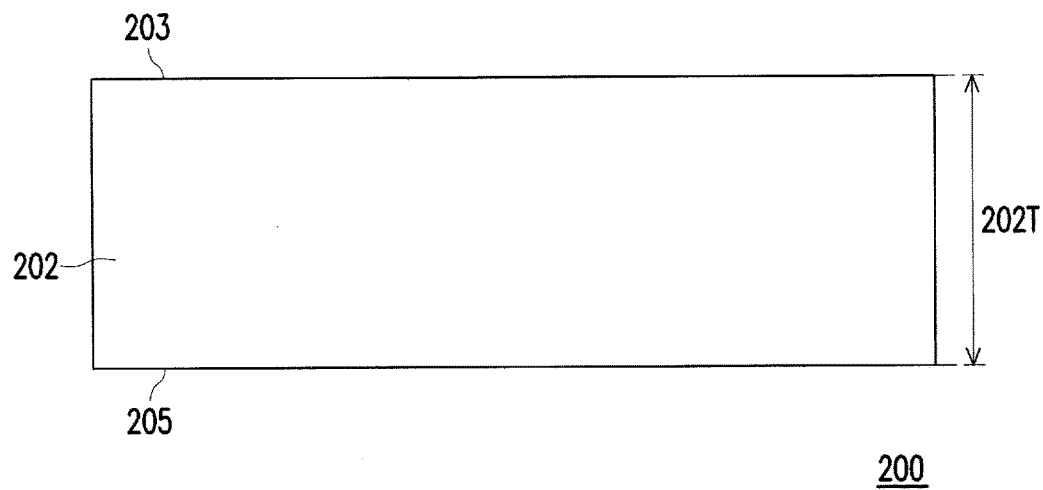
FIGS. 2A, 2B, 2C, 2D, 2E, 2F, 2G, 2H, 2I, 2J, 2K, 2L, 2M, 2N, 2O, 2P, 2Q, 2R, 2S, and 2T illustrate sectional views of an exemplary image sensor device during various fabrication stages, made by the method of FIG. 1, in accordance with some embodiments.

FIG. 1 illustrates a flowchart of a method 100 to form an image sensor device 200 according to one or more embodiments of the present invention. It is noted that the method 100 is merely an example, and is not intended to limit the present disclosure. Additional operations can be provided before, during, and after the method 100, and some operations described can be replaced, eliminated, or rearranged in order in accordance with additional embodiments. The method 100 is described below in conjunction with FIGS. 2A-2T that illustrate, in a cross-sectional view, a portion of the image sensor device 200 at various fabrication stages, in accordance with some embodiments.

The method 100 starts with operation 102 in which a substrate 202 having a front side 203 and a back side 205 is provided (FIG. 2A), in accordance with various embodiments. The substrate 202 includes a silicon substrate doped with a p-type dopant such as boron, in which case the substrate 202 is a p-type substrate. In some other embodiments, the substrate 202 may include another suitable semiconductor material. For example, the substrate 202 may be a silicon substrate that is doped with an n-type dopant such as phosphorous or arsenic, in which case the substrate 202 is an n-type substrate. Still in some other embodiments, the substrate 202 may include other elementary semiconductors such as germanium and diamond. The substrate 202 may optionally include a compound semiconductor and/or an alloy semiconductor. Further, in some alternative embodiments, the substrate 202 may include an epitaxial layer (epi layer), may be strained for performance enhancement, and may include a silicon-on-insulator (SOI) structure.

As shown, the substrate 202 has the front side 203 and the back side 205. The front side 203 may also be referred to as a front surface, and the back side 205 may also be referred to as a back surface, in accordance with some embodiments. The substrate 202 has an initial thickness 202T that is about 100 micrometers (μm) to about 3000 μm. In an embodiment, the initial thickness 202T is about 700 μm.

In some embodiments, the substrate 202 includes various regions such as, for example, a pixel-array region, a periphery region, a bonding pad region, and a scribe line region, etc. For simplicity, only the pixel-array region and the periphery region will be illustrated and described in the following discussions. In general, the pixel-array region is where arrays of radiation-sensing pixels/devices are to be formed. The periphery region is where non-radiation-sensing devices are formed, such as digital devices or control devices. The pixel-array region 210 (FIG. 2B) and the periphery region 250 (FIG. 2B) will be discussed in further detail as follows.

The method 100 continues to operation 104 in which the pixel-array region 210 and the periphery region 250 are respectively identified on the substrate 202 (FIG. 2B), in accordance with various embodiments. In some embodiments, the pixel-array region 210 and the periphery region 250 are defined based on various conditions determined by a manufacturer of the image sensor device 200. Upon the pixel-array region 210 and the periphery region 250 being identified, simultaneously with or subsequently to operation 104, a hard mask layer 204 is formed over the front side 203 of the substrate 202, and a patterned photoresist layer 206 is formed over the hard mask layer 204, in accordance with some embodiments. As shown, the patterned photoresist layer 206 includes plural openings 207 and 207' that are respectively formed in the pixel-array region 210 and the periphery region 250. The openings 207 and 207' are used to form respective features in the pixel-array region 210 and the periphery region 250, which will be discussed in further detail below.

Figure 2B:
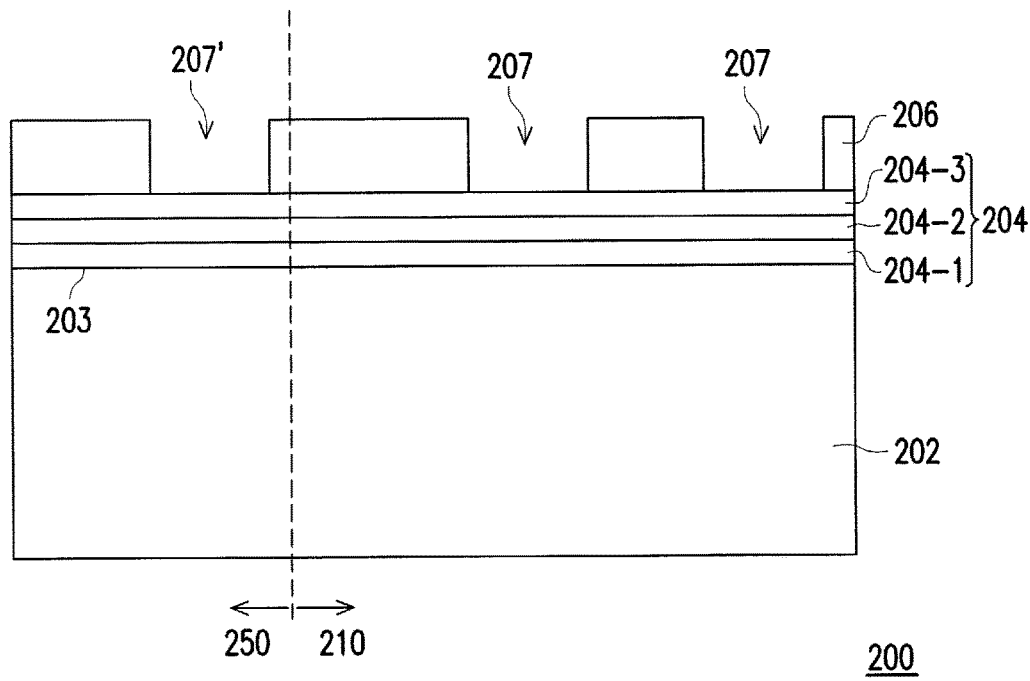

In some embodiments, the hard mask layer 204 includes plural sub-layers (e.g., oxide layers, nitride layers, etc.) 204-1, 204-2, and 204-3 stacked on top of one another, as illustrated in FIG. 2B. More specifically, the sub-layer 204-1 may be a pad oxide layer that has a thickness of about 5 nm to 10 nm; the sub-layer 204-2 may be a silicon nitride layer that has a thickness of about 50 nm to 100 nm; and the sub-layer 204-3 may be a high-density-plasma (HDP) oxide layer that has a thickness of about 400 nm to 800 nm. Each of the sub-layers of the hard mask layer 204 may be formed by at least one of a variety of deposition processes such as, for example, an atomic layer deposition (ALD) process, a chemical vapor deposition (CVD) process, a HDP-CVD process, a physical vapor deposition (PVD) process, etc. For clarity, in most of the following discussions and figures, the sub-layers of the hard mask layer 204 are not shown.

In some embodiments, the patterned photoresist layer 206 is formed by first forming a photoresist material (e.g., a negative tone photoresist material, a positive tone photoresist material, etc.) over a top surface of the hard mask layer 204 using a deposition process known in the art such as, for example, a spin-coating process, or the like. The photoresist material is then patterned in a photolithography process that may involve various exposure, developing, baking, stripping, and etching processes. As a result, the patterned photoresist layer 206 that has the openings 207 and 207' is formed.

Figure 2C:
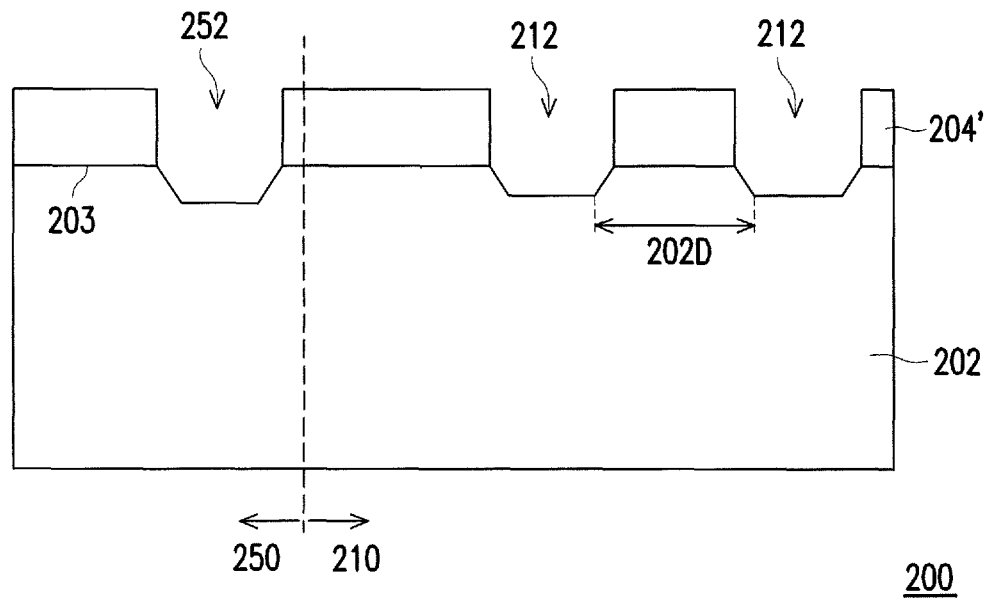

The method 100 continues to operation 106 in which shallow trenches 212 and 252 (FIG. 2C) are formed in the pixel-array region 210 and the periphery region 250, respectively, in accordance with various embodiments. In some embodiments, the shallow trenches 212 and 252 may be concurrently formed by using one or more (dry and/or wet) etching processes with the patterned photoresist layer 206 serving as a mask layer, which is subsequently removed after the etching process is completed. More specifically, the one or more etching processes are performed through the openings 207 of the photoresist layer 206 (FIG. 2B) on the hard mask layer 204 and further onto the substrate 202 so as to form the shallow trenches 212 in the pixel-array region 210, as shown in FIG. 2C, In some embodiments, the same one or more etching processes are concurrently performed through the openings 207' of the photoresist layer 206 (FIG. 2B) on the hard mask layer 204 and further onto the substrate 202 so as to form the shallow trenches 252 in the periphery region 250, as shown in FIG. 2C. Once the shallow trenches 212 and 252 are formed, the patterned photoresist layer 206 is removed such that a patterned hard mask layer 204' is left on the front side 203 of the substrate 202.

Such a spacing between neighboring shallow trenches 212 is used to form one or more components/devices (e.g., a radiation-sensing device) in the substrate 202, which will be discussed in further detail below.

Figure 2D:
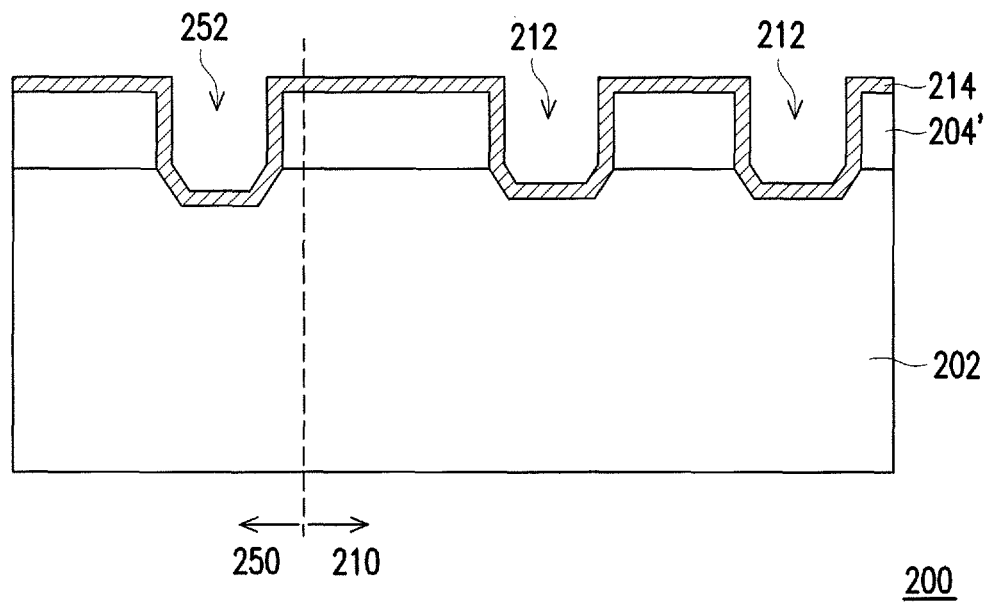

The method 100 continues to operation 108 in which a spacer layer 214 is formed over the shallow trenches 212 and 252, and the patterned hard mask layer 204' (FIG. 2D), in accordance with various embodiments. In some embodiments, such a spacer layer 214 is a conformal layer. That is, the spacer layer 214 has a substantially equal thickness (e.g., about 500 to 2000 angstrom (Å)) extending along the region on which the spacer layer 214 is formed. In some embodiments, the spacer layer 214 is formed of an oxide-based material, e.g., silicon oxide. In some alternative embodiments, the spacer layer 214 may include plural layers stacked to one another, e.g., an oxide-nitride layer, an oxide-nitride-oxide (ONO) layer, etc. Such a spacer layer 214 may be used as an additional mask layer to further shrink the critical dimension (CD) of a later formed deep trench isolation (DTI) feature, which will be discussed in further detail below. In some embodiments, the spacer layer 214 may be formed by any of various deposition processes known in the art such as, for example, a CVD process, a PVD process, an ALD process, or the like.

Figure 2E:
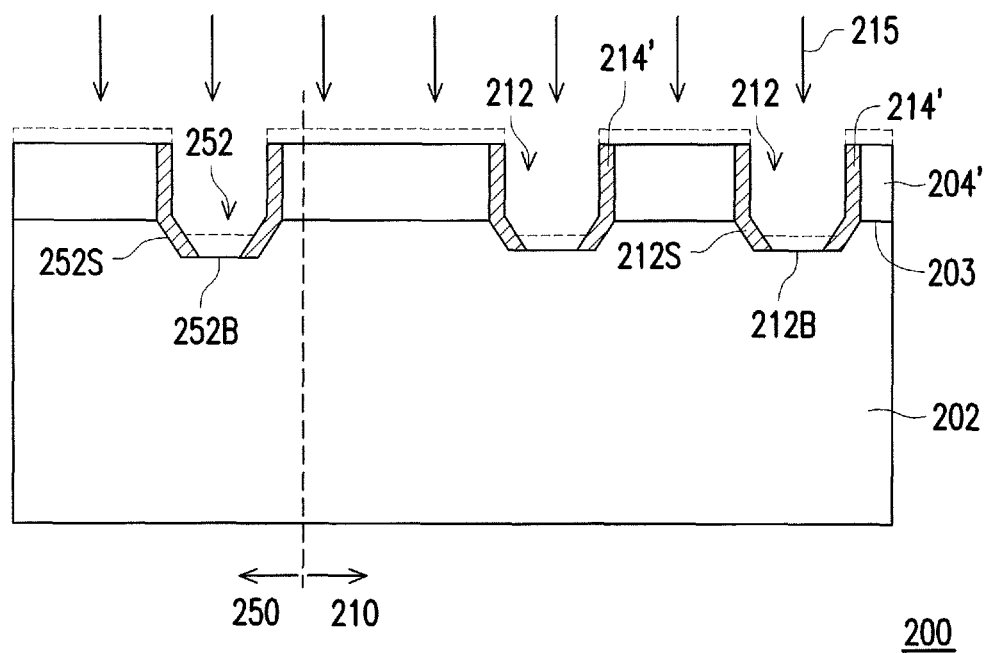

The method 100 continues to operation 110 in which some portions of the spacer layer 214 is etched (FIG. 2E), in accordance with various embodiments. As shown, at least one etching process 215 is performed over the substrate 202 so as to etch away a first portion of the spacer layer 214 that was formed on the top surface of the patterned hard mask layer 204'. Moreover, the etching process 215 is configured to concurrently etch away a second portion of the spacer layer 214 that was formed on a bottom surface 212B of the shallow trench 212 and a third portion of the spacer layer 214 that was formed on a bottom surface 252B of the shallow trench 252, respectively. For purposes of explanation, the etched away portions are enclosed by dotted lines in the illustrated embodiment of FIG. 2E. As such, one or more "recessed" front sides 203 (i.e., the bottom surfaces of the shallow trenches 212, 212B) in the pixel-array region 210 are exposed, and a remaining spacer layer 214' is formed. More specifically, the remaining spacer layer 214' is configured to cover, at least part of, sidewalls of the patterned hard mask layer 204' and the shallow trenches 212 and 252 (e.g., 212S, 252S, etc.), as shown in FIG. 2E. In some embodiments, the etching process 215 may include a dry etching process, a plasma-based dry etching process, and/or a variety of suitable dry etching processes know in the art.

Figure 2F:
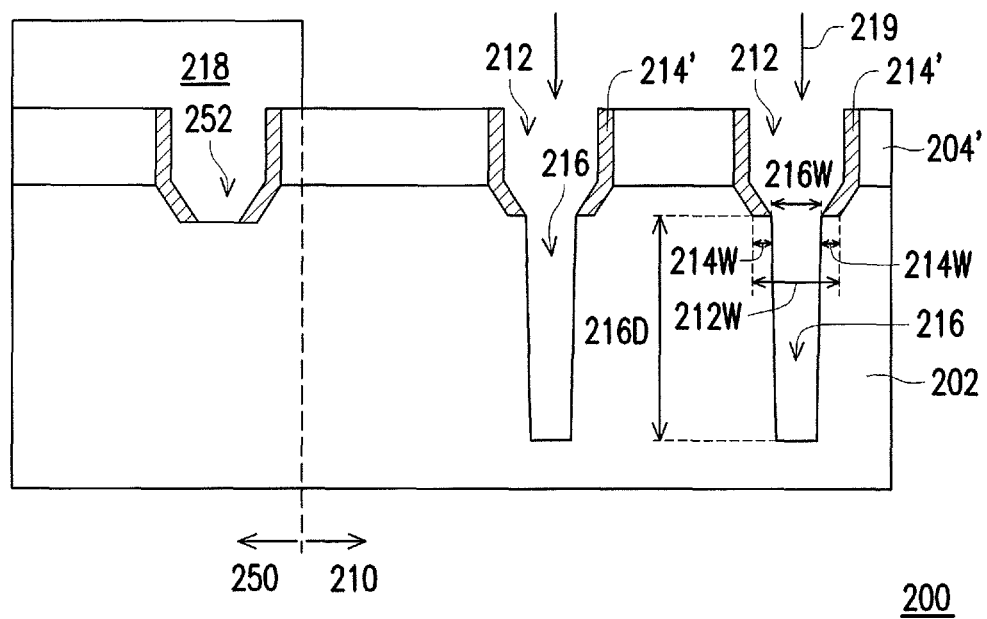

The method 100 continues to operation 112 in which one or more deep trenches 216 are formed in the pixel-array region 210 (FIG. 2F), in accordance with various embodiments. More specifically, in some embodiments, the operation 112 includes: forming a (patterned) photoresist layer 218 over a portion of the patterned hard mask layer 204' to cover the shallow trench 252 in the periphery region 250; and performing one or more etching processes 219 (e.g., a dry etching process and/or the like) on the exposed bottom surface 212B while using the photoresist layer 218 to block the periphery region 250 and the remaining spacer layer 214' as an additional etch-block layer, as mentioned above.

In general, the etching process 219 includes using plural accelerated ions (e.g., a plasma of reactive gases such as fluorocarbons, oxygen, chlorine, boron trichloride, etc.) to impinge the exposed bottom surface 212B so as to recess the substrate 202 and form the deep trench 216. According to various embodiments of the present disclosure, the remaining spacer layer 214' is configured to block, at least part of, the accelerated ions from impinging the substrate 202 such that a width of the formed deep trench 216, "216W," shrinks in a direction toward the bottom of the deep trench 216.

More specifically, in some embodiments, the width 216W may be determined by a width of the bottom surface 212B (FIG. 2E) of the shallow trench 212, "212W," and a thickness of the remaining spacer layer 214', "214W," for example, 216W=212W−2×214W. Since, in some embodiments, the remaining spacer layer 214' remains intact during the etching processes 215 (FIG. 2E) and 219 (FIG. 2F), the thickness 214W may be approximately the same as the thickness of the conformal spacer layer 214, which is about 500 Å to 2000 Å, as described above. Further, since the shallow trench 212 is formed by using the patterned hard mask layer 204', the width 212W may be approximately equal to the resolution of the respective photolithography process used to form the patterned hard mask layer 204'. It is noted that due to the remaining spacer layer 214' extending around the sidewall of the shallow trench 212, the width of the formed deep trench 216 further shrinks, which in turn may cause the CD (critical dimension) of a later formed DTI feature to be advantageously decreased. As the names imply, the deep trench 216 is typically recessed "deeper" than the shallow trench 212. Alternatively stated, the deep trench 216 extends the respective shallow trench 212 further into the substrate 202. For example, in some embodiments, the deep trench 216 can have a depth 216D of about 4 μm to 7 μm, which is deeper than a depth 212D of the shallow trench 212 that is about 150 nm to about 300 nm.

Figure 2G:
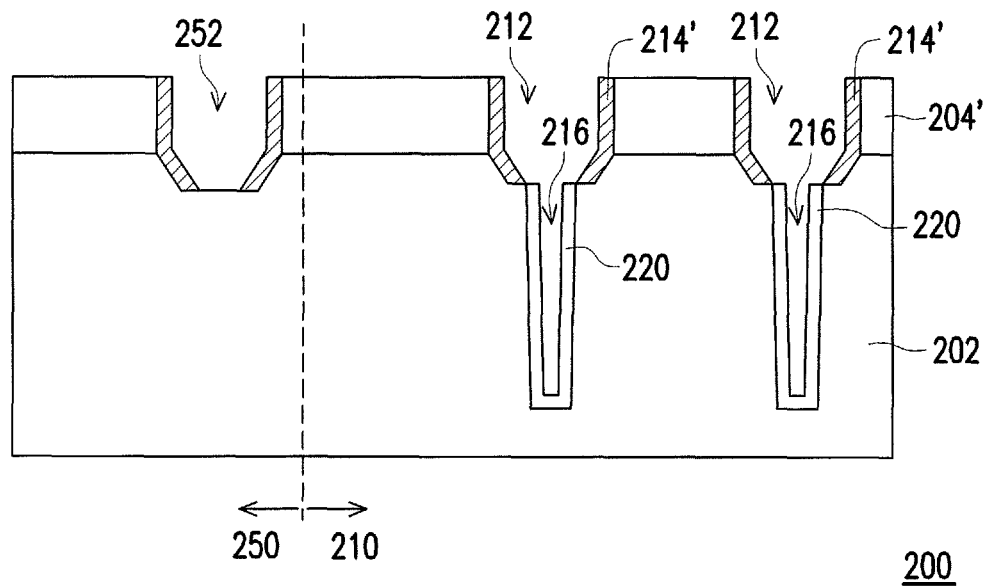

The method 100 continues to operation 114 in which a first oxide barrier layer 220 is formed in the deep trench 216 (FIG. 2G), in accordance with various embodiments. In some embodiments, the first oxide barrier layer 220 is formed to surround the deep trench 216, i.e., surrounding and covering sidewalls and bottom surface of the deep trench 216. The first oxide barrier layer 220 is configured to cure defects on the substrate 202 that may be caused by the etching process 219, and serve as a barrier layer for a later performed implantation process. Moreover, forming such an oxide barrier layer (e.g., 220) before the later performed implantation process may advantageously avoid implanted dopants from diffusing into the device 200's active region, for example, the region where a radiation-sensing device is formed. In some embodiments, the first oxide barrier layer 220 includes a substantially thin thickness that is less than about 100 Å. In some embodiments, the first oxide barrier layer 220 is formed by any of a variety of rapid thermal oxidation processes, e.g., an in-situ steam generation (ISSG) process (typically referred to as a wet oxidation process), a furnace-based oxidation process (typically referred to as a dry oxidation process), etc. In some embodiments, prior to, or simultaneously with forming the first oxide barrier layer 220, the photoresist layer 218 (FIG. 2F) may be removed.

Figure 2H:
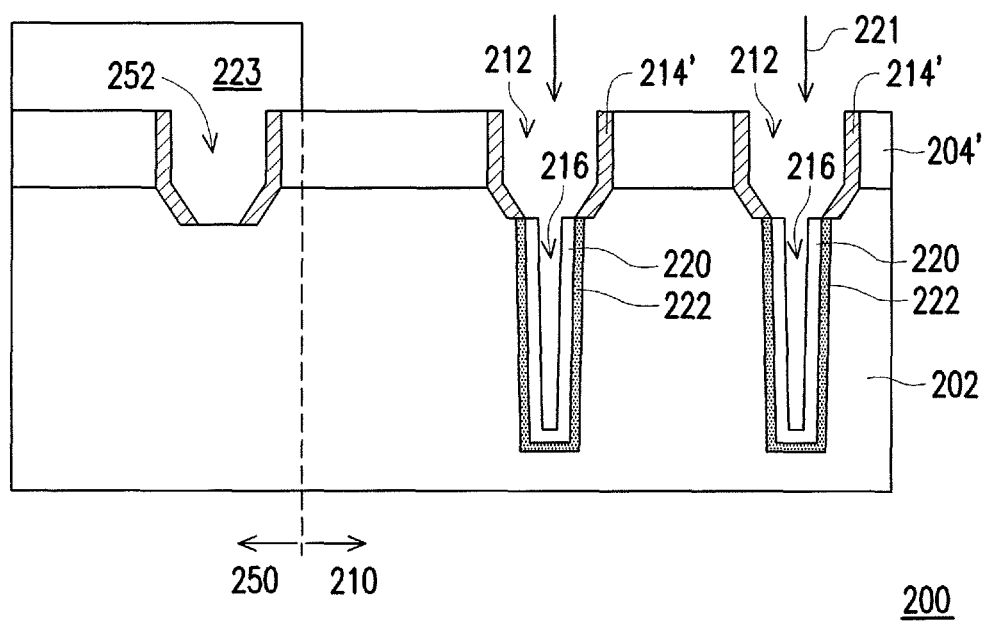

The method 100 continues to operation 116 in which a first liner layer 222 is formed in the substrate 202 to surround the deep trench 216 by using one or more ion implantation processes 221 (FIG. 2H), in accordance with various embodiments. The one or more ion implantation processes 221 may be performed after another (patterned) photoresist layer 223 is formed to cover periphery region 250. In some embodiments, the ion implantation process 221 includes providing a plurality of dopants to impinge through the first oxide barrier layer 220, and the sidewalls and the bottom surface of the deep trench 216. As such, the first liner layer 222 may be formed below the deep trench 216. More specifically, by using the first oxide barrier layer 220, the impinged dopants may reside (concentrate) in a region of the substrate 202 that is substantially adjacent to the sidewalls and the bottom surface of the deep trench 216, which in turn causes the first liner layer 222 to surround the deep trench 216 (as illustrated in FIG. 2H). In some embodiments, depending on an energy level used to perform the ion implantation process 221, the first liner layer 222 may have a thickness (depth) of about 50 nm. In some embodiments, a polarity of the dopants used in the ion implantation process 221 may be the same as the doped polarity of the substrate 202. For example, when the substrate 202 is doped with a p-type dopant, the dopants used in the ion implantation process 221 may also be p-type. In some embodiments, the energy level used to perform the ion implantation process 221 may range from 15 keV to 20 keV. In some embodiments, a doping concentration of the first liner layer 222 may be about $10^{19}$ cm$^{-3}$. In some other embodiments, the ion implantation process 221 may be replaced with a plasma doping process, and/or a solid phase doping process while remaining within the scope of the present disclosure.

Figure 2I:
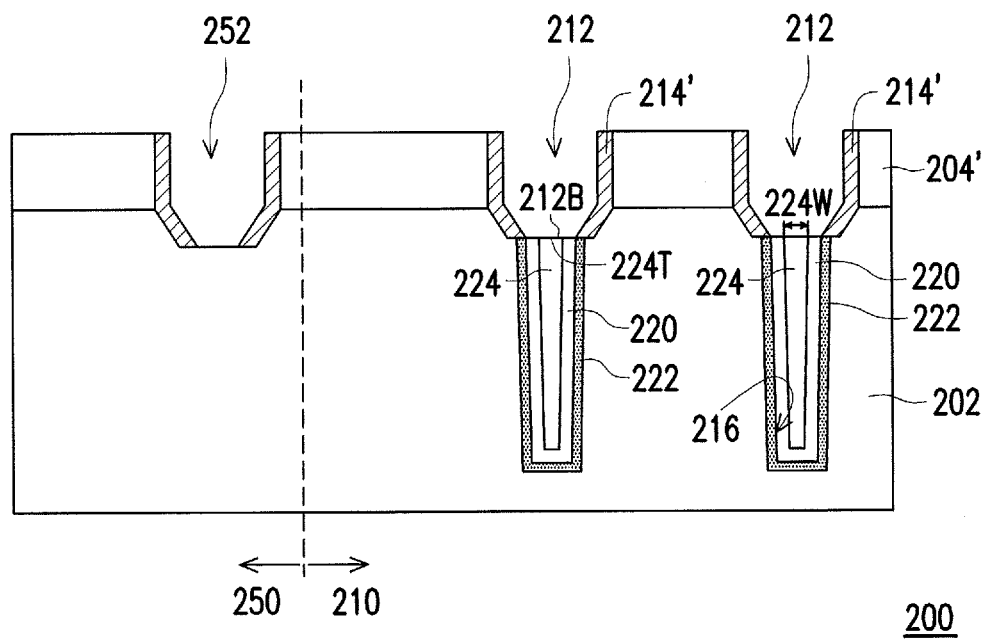

As mentioned above, processes (e.g., the etching process 219) used to form the deep trenches 216 may result in defects (e.g., dangling bonds) on the surface of the substrate 202, e.g., the sidewalls and the bottom surface of the deep trench 216. These defects may be physical defects or electrical defects, which may trap carriers such as electrons. The trapped carriers may produce leakage current. In general, leakage current is problematic for image sensor devices, for example, the image sensor device 200. For example, with a sufficient amount of leakage current, radiation-sensing devices (not formed yet at this stage of fabrication) may falsely detect "light," even when the image sensor device 200 is placed in an optically dark environment. Alternatively stated, the image sensor device 200 may end up "sensing" light when it is not supposed to do so (since there is actually no light). In this situation, the leakage current may be referred to as a "dark current," and a pixel containing such a radiation-sensing device is typically referred to as a "white pixel." Dark currents and white pixels are forms of (electrical) cross-talk, which degrades the overall optical performance of the image sensor device 200 and are therefore undesirable The method 100 continues to operation 118 in which a deep trench isolation (DTI) feature 224 is formed in the pixel-array region 210 (FIG. 2I), in accordance with various embodiments. As shown, the DTI feature 224 fills the deep trench 216 with the first oxide barrier layer 220 stacked therebetween. In some embodiments, when there is a dielectric layer (e.g., the first oxide barrier layer 220) formed over the deep trench 216, a first isolation material used to fill the deep trench 216 may include a polysilicon material, a metal material, and/or a dielectric material. On the other hand, in some other embodiments, when no such dielectric layer is formed over the deep trench 216, the first isolation material used to fill the deep trench 216 may include a dielectric material such as, for example, silicon oxide, silicon nitride, a low dielectric constant (low-k) material, and/or a combination thereof. The low-k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SiLK (Dow Chemical, Midland, Mich.), polyimide, porous polymer and/or other suitable materials as examples.

In some embodiments, the formation of the DTI feature 224 may include at least one of the following process steps: depositing at least one of the above-mentioned first isolation material over the substrate 202 using any of a variety of deposition processes (e.g., a CVD process, an ALD process, a PVD process, etc.); performing one or more (dry/wet) etching processes to etch away the first isolation material until a top surface 224T of the DTI feature 224 being aligned with the bottom surface 212B of the shallow trench 212; and performing a cleaning process to remove excessive first isolation material.

It is noted that the formed DTI feature 224 has a width 224W. Generally, such a width 224W is referred to as the critical dimension (CD) of the DTI feature 224. In some embodiments, the CD of the DTI feature 224 (i.e., 224W) is substantially close to the width 216W of the deep trench 216 since the thickness of the first oxide barrier layer 220 (typically less than 100 Å) is negligibly small compared to the width 216W, i.e., the CD of the DTI feature 224 is approximately equal to 216W. Thus, according to some embodiments of the present disclosure, the CD of the respective DTI feature (e.g., 224) can be further reduced from the resolution of the respective photolithography process because of the above-described equation, $216W = 212W - 2 \times 214W$, wherein 212W is approximately the resolution of the respective photolithography process and 214W is the thickness of the spacer layer 214.

Figure 2J:
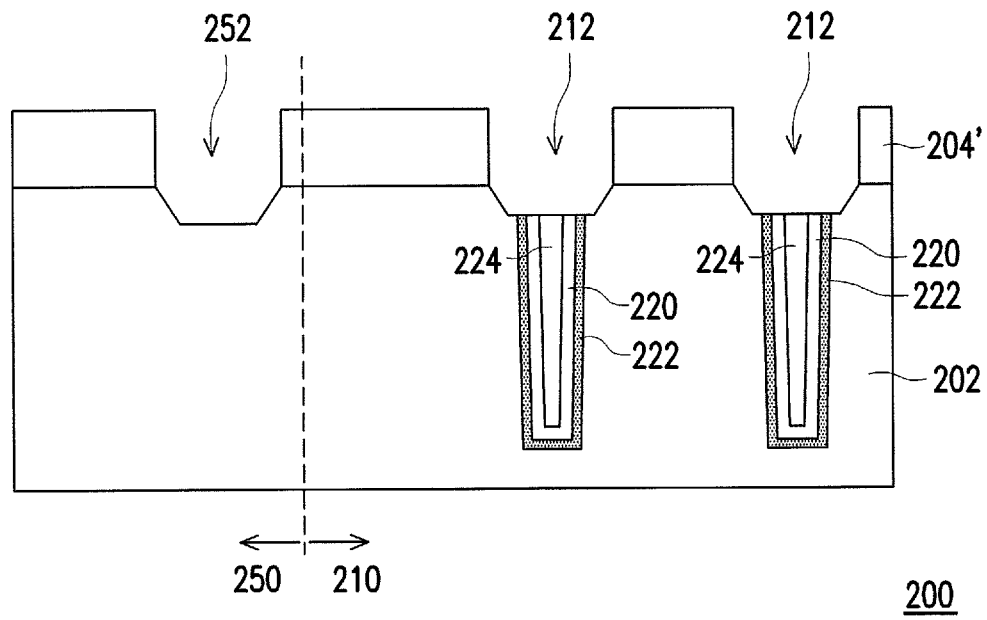

The method 100 continues to operation 120 in which the remaining spacer layer 214' is removed (FIG. 2J), in accordance with various embodiments. More specifically, the remaining spacer layer 214' is removed from the sidewall of the patterned hard mask layer 204' and the sidewalls of the shallow trench 212 (and also the shallow trench 252 in the periphery region 250). Any of a variety of etching processes (e.g., a dry etching process, a wet etching process, etc.) may be used to remove the remaining spacer layer 214', in accordance with some embodiments.

Figure 2K:
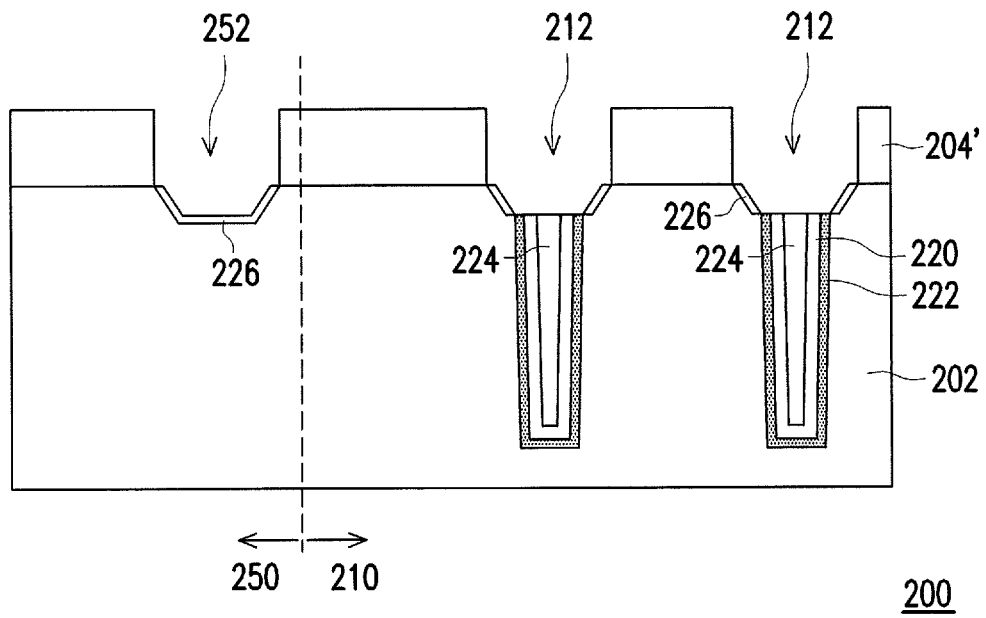

The method 100 continues to operation 122 in which a second oxide barrier layer 226 is formed (FIG. 2K), in accordance with various embodiments. More specifically, in some embodiments, the second oxide barrier layer 226 may be formed over the sidewalls of the shallow trench 212, and also over sidewalls and bottom surface of the shallow trench 252. Similar to the first oxide barrier layer 220, the formation of the second oxide barrier layer 226 may advantageously avoid later implanted dopants from diffusing into the device 200's active region, for example, the region where a radiation-sensing device is formed. In some embodiments, the second oxide barrier layer 226 includes a substantially thin thickness that is less than about 100 Å. In some embodiments, the second oxide barrier layer 226 is formed by any of a variety of rapid thermal oxidation processes, e.g., an in-situ steam generation (ISSG) process (typically referred to as a wet oxidation process), a furnace-based oxidation process (typically referred to as a dry oxidation process), etc.

Figure 2L:
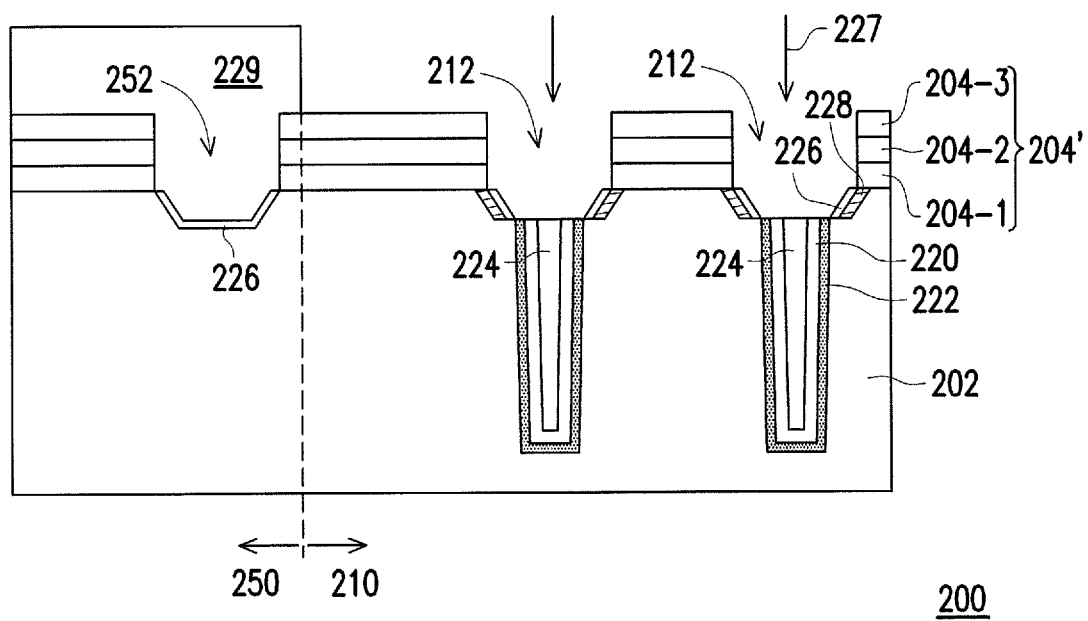

More specifically, by using the second oxide barrier layer 226, the impinged dopants may reside (concentrate) in a region of the substrate 202 that is substantially adjacent to the sidewalls of the shallow trench 212, which in turn causes the second liner layer 228 to surround the sidewalls of the shallow trench 212 (as illustrated in FIG. 2L).

Figure 2M:
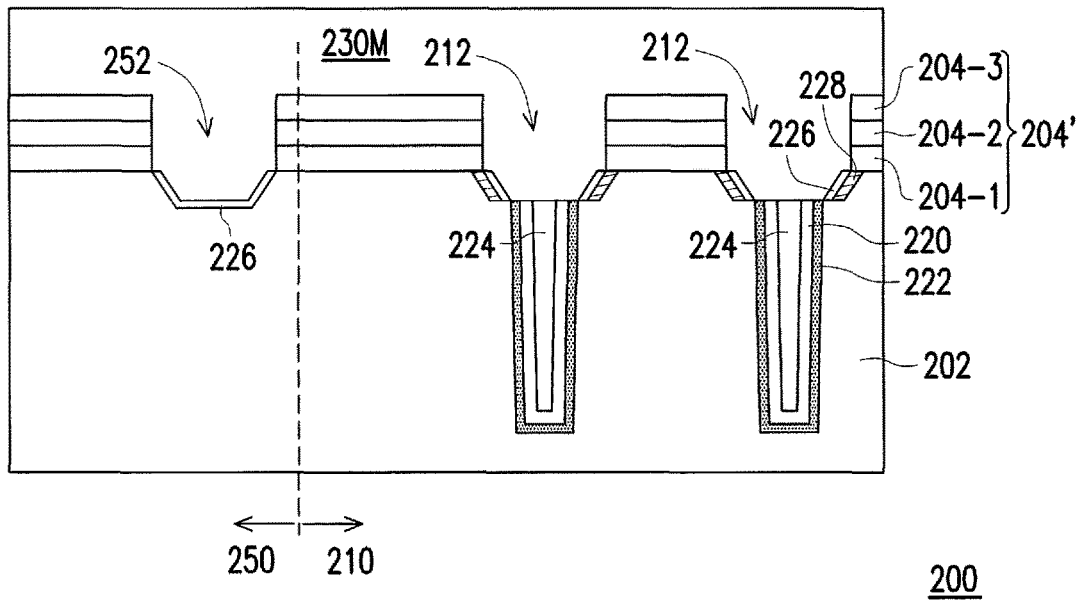
Figure 2N:
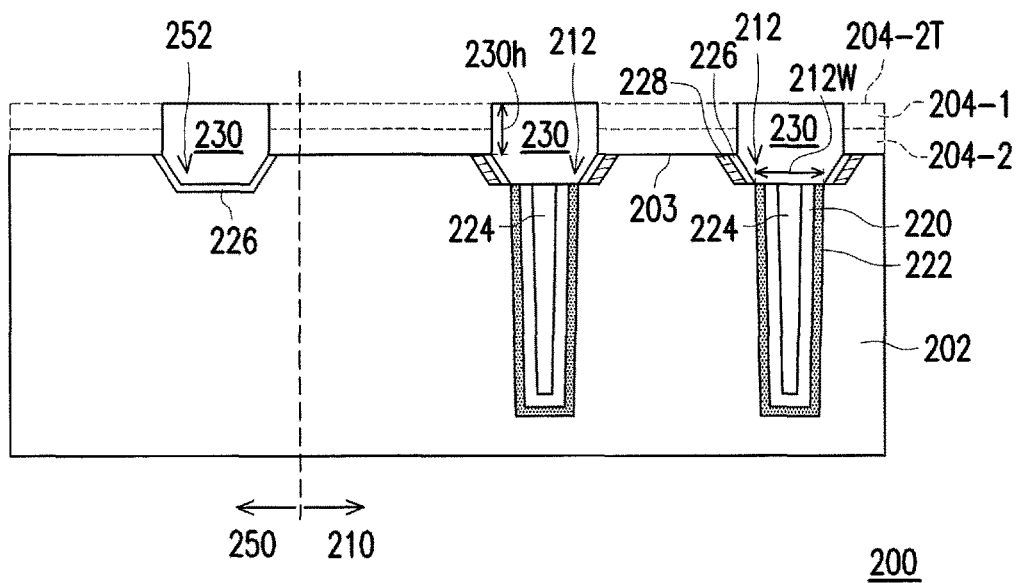

The method 100 continues to operation 126 in which shallow trench isolation (STI) features 230 are formed in both of the pixel-array and periphery regions (210 and 250) (FIGS. 2M and 2N), in accordance with various embodiments. For the purpose of explanation, the patterned hard mask layer 204', in FIG. 2M, is again illustrated as having the respective sub-layers: 204-1, 204-2, and 204-3. To recap, the sub-layer 204-1 may include a pad oxide layer; the sub-layer 204-2 may include a silicon nitride layer; and the sub-layer 204-3 may include a high-density-plasma (HDP) oxide layer. In some embodiments, after the second liner layer 228 is formed to surround the respective shallow trench 212 in the pixel-array region 210, the photoresist layer 229 over the periphery region 250 is removed.

In some embodiments, the formation of the STI features 230 includes forming a second isolation material 230M (FIG. 2M) over the patterned hard mask layer 204' so as to fill the shallow trenches 212 and 252 and cover the patterned hard mask layer 204'.

Subsequently, in some embodiments, the remaining portions of patterned hard mask layer 204' (e.g., the sub-layers 204-1 and 204-2) are removed. For explanation, the removed sub-layers 204-1 and 204-2 are enclosed by dotted lines in the illustrated embodiment of FIG. 2N. As such, the STI features 230 along the front side 203 of the substrate 202 are respectively formed in the pixey-array region 210 and the periphery region 250. In some embodiments, the STI features 230 may protrude beyond the front side 203. Moreover, the STI features 230 in both of the pixey-array region 210 and the periphery region 250 may share a same height 230h. In some embodiments, the height 230h is about 0.03 μm to about 0.08 μm. In general, the critical dimension (CD) of the STI feature 230 is typically referred to as the width 212W of the bottom surface of the shallow trench 212.

Thus, in some embodiments, the CD of the respective STI feature (e.g., 230) is about the resolution of the respective photolithography process, i.e., 212W.

The method 100 continues to operation 128 in which a radiation-sensing device 232 and a non-radiation-sensing device 254 are respectively formed in the pixel-array region 210 and the periphery region 250 (FIG. 2O), in accordance with various embodiments. As mentioned above, the radiation-sensing device 232 (e.g., a photodiode, a photogate, etc.) is configured to sense or detect radiation waves (e.g., light) projected toward the radiation-sensing device 232 through either the front side 203 or the back side 205 of the substrate 202, which will be discussed in further detail below.

Figure 2O:
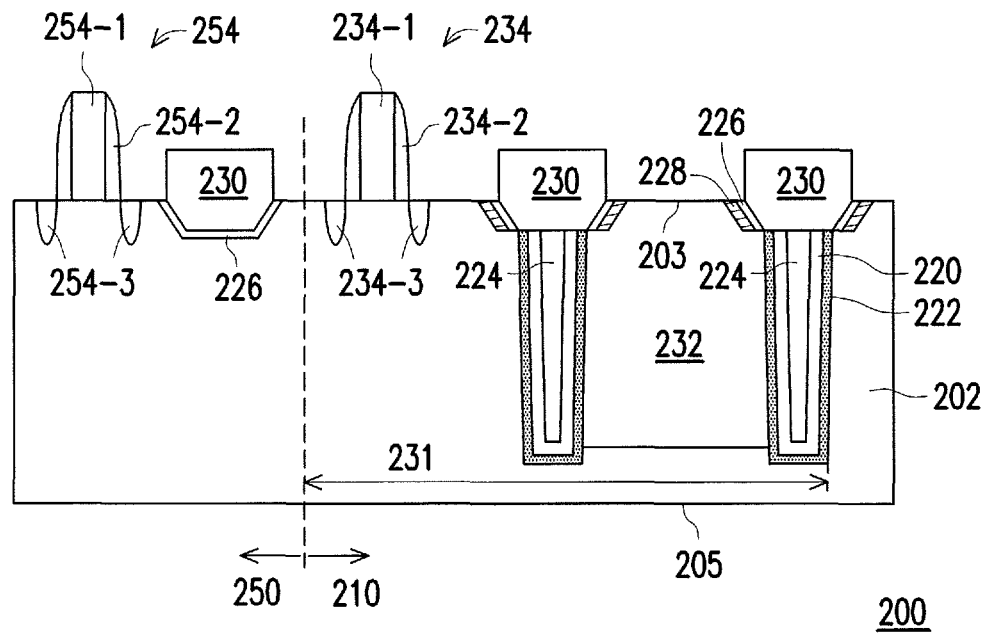

In some embodiments, the radiation-sensing device 232 is formed between neighboring STI/DTI features 224/230, as shown in FIG. 2O. In other words, the radiation-detection device 232 is isolated from other radiation-detection devices (not shown) by the respective STI/DTI features 230/224.

In some embodiments, the radiation-sensing device 232 is formed by performing one or more ion implantation processes on the substrate 202 from the front side 203.

Referring still to FIG. 2O, on the other region of the substrate 202 (i.e., the periphery region 250), the non-radiation-sensing device 254 may be a control or a digital device that is kept in an optically dark environment. For example, the non-radiation-sensing device 254 may be an application-specific integrated circuit (ASIC) device or a system-on-chip (SOC) device. In some embodiments, the non-radiation-sensing device 254 may be implemented by a transistor that includes a gate electrode 254-1, spacers 254-2 along sidewalls of the gate electrode 254-1, and source/drain features 254-3, for example. According to some embodiments, prior to, simultaneously with, or subsequently to the formation of the pixel 231 in the pixel-array region 210, the non-radiation-sensing device 254 may be formed by existing CMOS fabrication technologies.

Figure 2P:
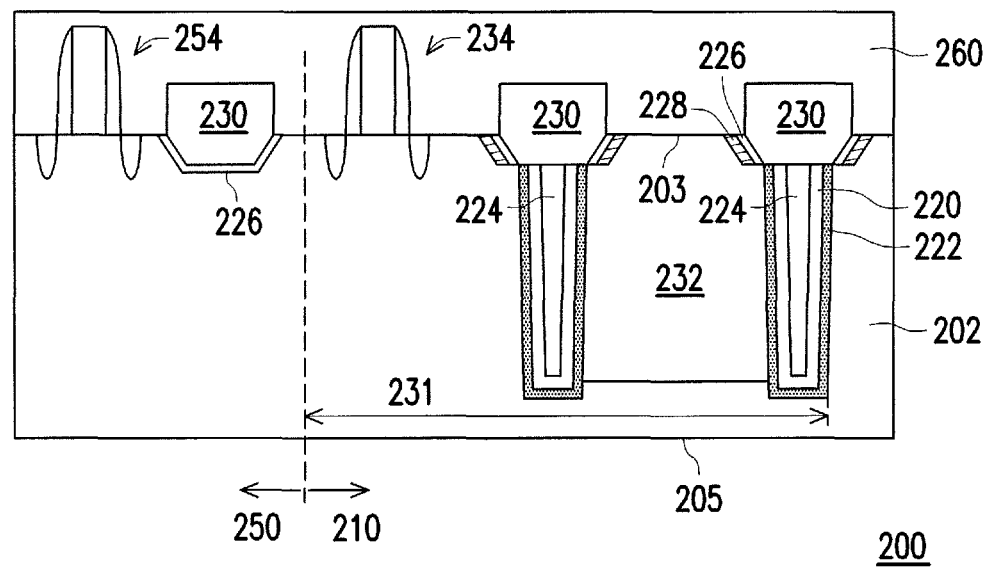

The method 100 continues to operation 130 in which one or more interconnection layers 260 are formed over the front side 203 of the substrate 202 (FIG. 2P), in accordance with various embodiments. The interconnection layer 260 is formed over the front side 203 of the substrate 202. In some embodiments, the interconnection layer 260 includes a plurality of patterned dielectric layers and conductive layers that provide interconnections (e.g., wiring) between various doped features (e.g., 232), circuitry (e.g., 234, 254, etc.), and input/output of the image sensor device 200. In some embodiments, the interconnection layer 260 includes plural interlayer dielectric (ILD) layers and multilayer interconnect (MLI) structures formed in a configuration such that each ILD layer separates and isolates one MLI structure from another MLI structure. The MLI structure includes contacts/vias and metal lines formed on the substrate 202. For simplicity, these contacts/vias and metal lines are not illustrated in the illustrated embodiment of FIG. 2P.

In one example, the MLI structure may include conductive materials such as aluminum, aluminum/silicon/copper alloy, titanium, titanium nitride, tungsten, polysilicon, metal silicide, or combinations thereof, being referred to as aluminum interconnects. In some embodiments, such aluminum interconnects may be formed by a deposition process including a PVD process, a CVD process, a sputtering process, or a combination thereof. Other manufacturing techniques to form the aluminum interconnect may include photolithography processing and etching to pattern the conductive materials for vertical connection (contacts/vias) and horizontal connection (conductive lines). Alternatively, a copper multilayer interconnect may be used to form the vertical connection (contacts/vias) and horizontal connection (conductive lines), and is thus referred to as copper interconnects. The copper interconnects may include conductive materials such as, for example, copper, copper alloy, titanium, titanium nitride, tantalum, tantalum nitride, tungsten, polysilicon, metal silicide, or combinations thereof. The copper interconnects may be formed by a deposition process including a PVD process, a CVD process, a sputtering process, or a combination thereof.

Figure 2Q:
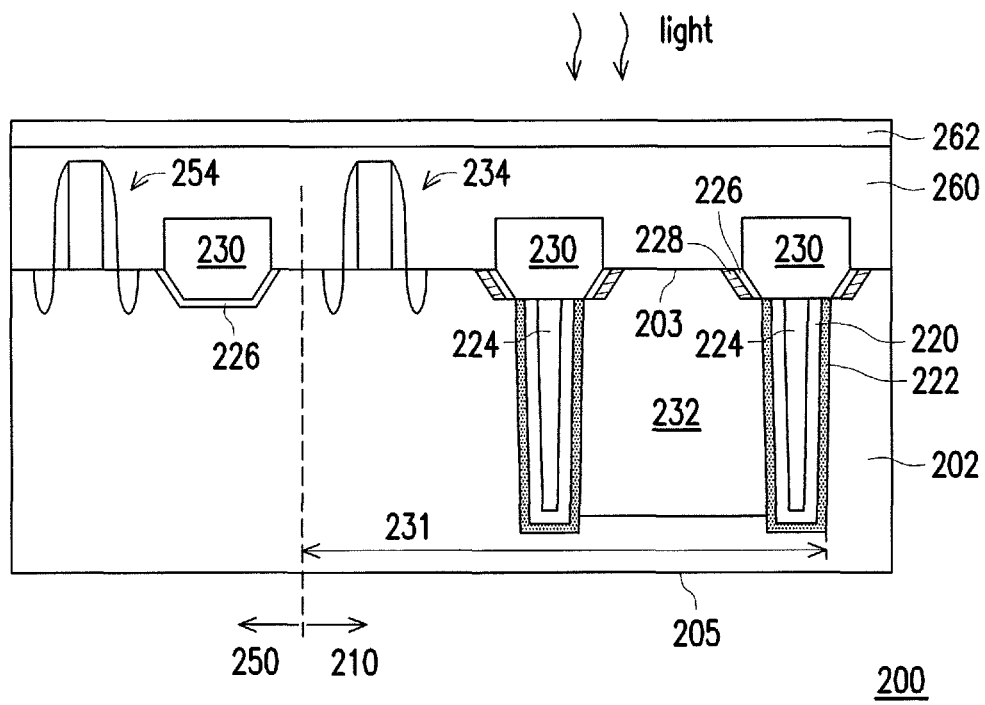

The method 100 continues to operation 132 in which further process steps are performed to form the image sensor device 200 as either a front side illuminated (FSI) or a back side illuminated (BSI) image sensor device, in accordance with various embodiments. For example, FIG. 2Q is directed to forming the image sensor device 200 as an FSI image sensor device. And FIGS. 2R, 2S, and 2T are directed to forming the image sensor device 200 as a BSI image sensor device.

Referring to FIG. 2Q, in order to form the image sensor device 200 an FSI image sensor device, a passivation layer 262 may be formed over the interconnection layer 260. The passivation layer 262 is configured to protect internal circuits/components (e.g., the pixel 231) from external environmental effects such as moisture, dust, etc. Silicon nitride and/or silicon oxynitride is typically used as a material to form the passivation layer 262. In some embodiments, the passivation layer 262 is formed as a substantially thin layer (e.g., with a thickness of about 50 nm to about 200 nm) to make the passivation layer 262 substantially transparent so as to allow incident radiation waves (e.g., light) to pass through and reach the below radiation-sensing device(s) (e.g., 232). Although not shown, in some embodiments, one or more optical components (e.g., color filters, lenses, etc.) that are used to receive/modulate the incident light may be formed over the passivation layer 262. Since the image sensor device 200 is used as an FSI image sensor device in the illustrated embodiment of FIG. 2Q, the incident light may be projected to the image sensor device 200 from the respective front side 203 through the substantially transparent passivation layer 262, as mentioned above. In some embodiments, the passivation layer 262 may be formed by any of a variety of deposition processes, for example, a CVD process, an ALD process, a PVD process, or the like. Further, after the formation of the passivation layer 262, one or more patterning process may be performed to form openings in the passivation layer 262 so as to allow external contact(s)/device(s) to be coupled to the image sensor device 200 from the front side 203.

Figure 2R:
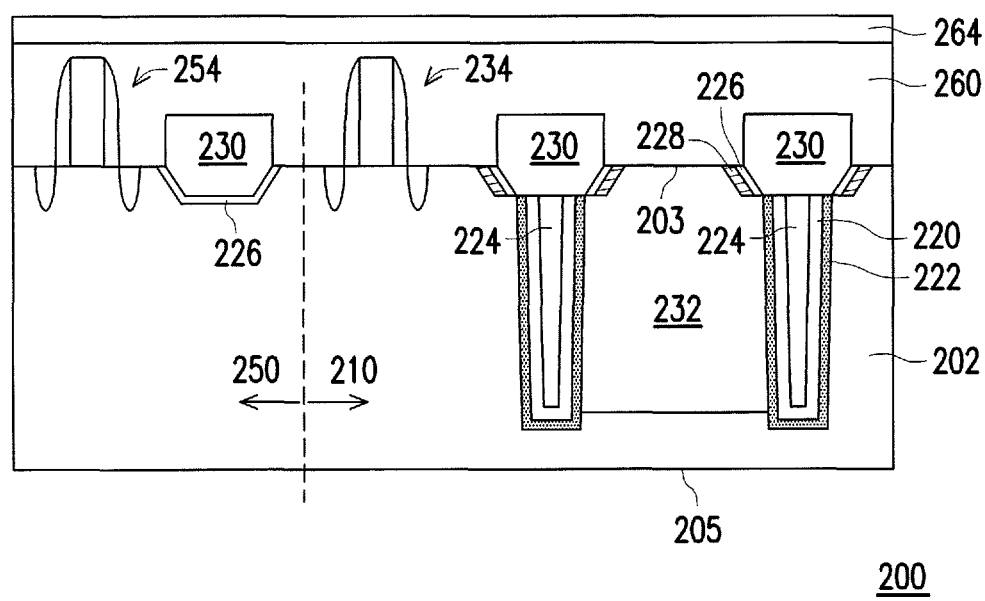
Figure 2S:
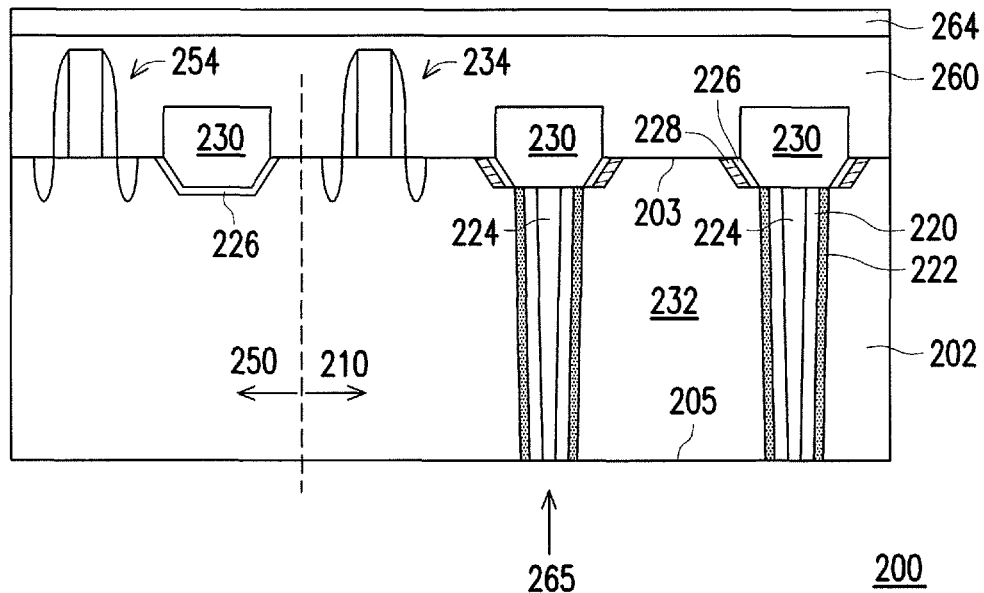
Figure 2T:
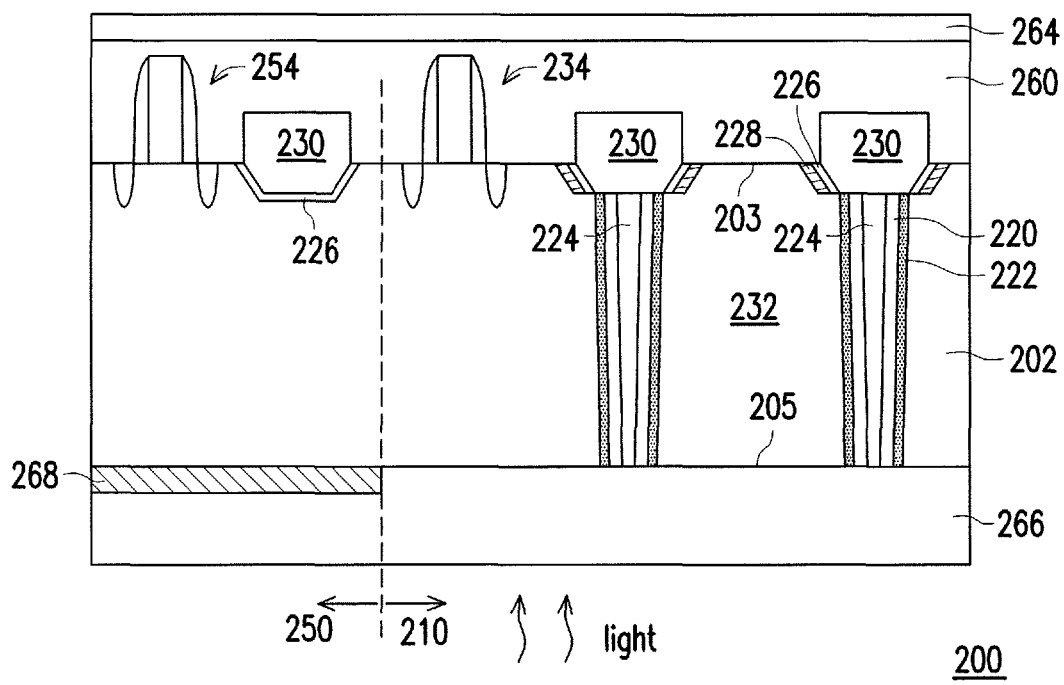

On the other hand, in order to form the image sensor device 200 a BSI image sensor device, the further process steps may include: forming a carrier substrate 264 over the interconnection layer 260, performing a thinning process 265 on the back side 205 of the substrate 202, and forming a passivation layer over the back side 205, which are illustrated in FIGS. 2R, 2S, and 2T, respectively.

In some embodiments, the carrier substrate 264 may be bonded to a top surface of the interconnection layer 260 with a buffer layer (not shown) stacked therebetween, as shown in FIG. 2R. As such, further process steps are allowed to be performed on the back side 205 of the substrate 202. In some embodiments, the carrier substrate 264 is bonded to the interconnection layer 260 by molecular forces. The carrier substrate 264 may be similar to the substrate 202, e.g., a silicon substrate. Alternatively, the carrier substrate 264 may optionally include a glass substrate.

In some embodiments, the carrier substrate 264 is configured to provide protection for the various features formed on the front side 203 of the substrate 202. The carrier substrate 264 is further configured to provide mechanical strength and support when the process steps are performed on the back side 205 of the substrate 202, which will be discussed below. Optionally, an annealing process may be performed to enhance bonding strength.

For example, the thinning process 265 does not end until respective bottom portions of the DTI features 224 have been reached, so that the radiation-sensing devices 232 can be isolated from other devices (e.g., other radiation-detection devices in other pixels) by the DTI features 224.

In FIG. 2T, according to some embodiments, a passivation layer 266 may be formed over the back side 205 of the substrate 202. The passivation layer 266 may be substantially similar to the passivation layer 262 (FIG. 2Q) used in the FSI image sensor device. As such, the passivation layer 266 may be formed of silicon nitride and/or silicon oxynitride with a thickness of about 50 nm to 200 nm. Similarly, although not shown, in some embodiments, one or more optical components (e.g., color filters, lenses, etc.) that are used to receive/modulate incident radiation waves (e.g., light) may be formed over the passivation layer 266. Since the image sensor device 200 is used as a BSI image sensor device in the illustrated embodiment of FIG. 2T (and FIGS. 2R and 2S), the incident light may be projected to the image sensor device 200 from the respective back side 205 through the substantially transparent passivation layer 266, as mentioned above. In some embodiments, the passivation layer 266 may be formed by any of a variety of deposition processes, for example, a CVD process, an ALD process, a PVD process, or the like. In some embodiments, before forming the passivation layer 266 over the back side 205, a metal block layer 268 may be formed over the back side 205 but only in the periphery region 250, as shown in FIG. 2T. Such metal block layer 268 may be used to block radiation waves (e.g., light) projected toward the back side 205 since, in general, the non-radiation-sensing device 254 is designed to be kept in an optically dark environment. Similarly, after the formation of the passivation layer 266, one or more patterning process may be performed to form openings in the passivation layer 266 so as to allow external contact(s)/device(s) to be coupled to the image sensor device 200 from the back side 205.

In an embodiment, a method for forming an image sensor device on a substrate is disclosed. The method includes (a) recessing a portion of the substrate thereby forming a first shallow trench; (b) forming a spacer layer surrounding at least part of a sidewall of the first shallow trench; and (c) forming a first deep trench that extends below the first shallow trench by further recessing the substrate while using the spacer layer as a mask.

In another embodiment, a method for forming an image sensor device on a substrate includes (a) recessing the substrate thereby forming a first shallow trench and a second shallow trench that are in a pixel-array region and a periphery region of the substrate, respectively; (b) forming a spacer layer surrounding respective sidewalls of the first and second shallow trenches; and (c) forming a first deep trench that extends below the first shallow trench by further recessing the substrate while using the spacer layer as a mask.

Yet in another embodiment, a method for forming an image sensor device on a substrate includes (a) recessing the substrate thereby forming a first shallow trench; (b) forming a spacer layer surrounding at least part of a sidewall of the first shallow trench; (c) forming a first deep trench that extends below the first shallow trench by further recessing the substrate while using the spacer layer as a mask; (d) forming a first in-situ steam generation (ISSG) oxide layer overlaying the first deep trench; (e) forming a first liner layer in the substrate surrounding the first deep trench; and (f) filling the first deep trench with a first isolation material thereby forming a first deep trench isolation (DTI) feature in the substrate.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor device on a substrate, comprising:
 (a) recessing a portion of the substrate thereby forming a first shallow trench;
 (b) forming a spacer layer surrounding at least part of a sidewall of the first shallow trench;
 (c) forming a first deep trench that extends below the first shallow trench by further recessing the substrate while using the spacer layer as an intact mask thereby shrinking a width of the first deep trench;
 (d) removing the spacer layer;
 (e) forming a second oxide layer over the sidewall of the first shallow trench;
 (f) forming a second liner layer in the substrate surrounding the first shallow trench; and
 (g) filling the first shallow trench with a first isolation material thereby forming a first shallow trench isolation (STI) feature in the substrate.

2. The method of claim 1, wherein the forming the spacer layer further includes:
 forming an initial spacer layer conformally overlaying the first shallow trench; and
 etching a bottom portion of the initial spacer layer in the first shallow trench thereby exposing a bottom surface of the first shallow trench.

3. The method of claim 1, wherein the first shallow trench extends inwardly into the substrate with a first depth, and the first deep trench further extends from the first shallow trench inwardly into the substrate with a second depth, the second depth being substantially greater than the first depth.

4. The method of claim 1, further comprising:
 (h) forming a first oxide layer in the first deep trench;
 (i) forming a first liner layer in the substrate surrounding the first deep trench;
 (j) filling the first deep trench with a second isolation material thereby forming a first deep trench isolation (DTI) feature in the substrate.

5. The method of claim 4, wherein the first DTI and STI features are formed in a pixel-array region of the substrate where one or more radiation-sensing devices are to be formed.

6. The method of claim 4, further comprising:
 repeating steps of (a)-(j) thereby forming a second DTI feature and a second STI feature in the substrate, wherein the second DTI feature is below the second STI feature, and wherein the second DTI and STI features are spaced from the first DTI and STI features by a distance.

7. The method of claim 6, further comprising:
forming at least a radiation-sensing device in the substrate that is between the first DTI and STI features and the second DTI and STI features.

8. A method for forming an image sensor device on a substrate, comprising:
 (a) recessing the substrate thereby forming a first shallow trench and a second shallow trench that are in a pixel-array region and a periphery region of the substrate, respectively;
 (b) forming a spacer layer surrounding respective sidewalls of the first and second shallow trenches;
 (c) forming a first deep trench that extends below the first shallow trench by further recessing the substrate while using the spacer layer as an intact mask thereby shrinking a width of the first deep trench;
 (d) removing the spacer layer;
 (e) forming one or more barrier layers on or over the sidewall of each of the first and second shallow trenches; and
 (f) filling the first shallow trench and the second shallow trench with a second isolation material thereby forming a first shallow trench isolation (STI) feature in the pixel-array region, and the second shallow trench with the second isolation material thereby forming a second STI feature in the periphery region.

9. The method of claim 8, wherein the forming the spacer layer further includes:
 forming an initial spacer layer conformally overlaying the first and second shallow trenches; and
 etching respective bottom portions of the initial spacer layer first and second shallow trenches thereby exposing respective bottom surfaces of the first and second shallow trenches.

10. The method of claim 8, wherein the forming the first deep trench further includes:
 covering the second shallow trench; and
 performing at least an etching process to further recessing the substrate through the first shallow trench.

11. The method of claim 8, further comprising:
 (g) forming a first oxide layer in the first deep trench;
 (h) forming a first liner layer in the substrate surrounding the first deep trench;
 (i) filling the first deep trench with a first isolation material thereby forming a first deep trench isolation (DTI) feature in the substrate.

12. The method of claim 8, wherein the first and second STI features protrude beyond a top surface of the substrate and share a substantially similar height.

13. The method of claim 8, wherein the first shallow trench extends inwardly into the substrate with a first depth, and the first deep trench further prolongs the first shallow trench inwardly into the substrate with a second depth, the second depth being substantially greater than the first depth.

14. A method for forming an image sensor device on a substrate, comprising:
 (a) recessing the substrate thereby forming a first shallow trench;
 (b) forming a spacer layer surrounding at least part of a sidewall of the first shallow trench;
 (c) forming a first deep trench that extends below the first shallow trench by further recessing the substrate while using the spacer layer as an intact mask thereby shrinking a width of the first deep trench;
 (d) forming a first in-situ steam generation (ISSG) oxide layer overlaying the first deep trench;
 (e) forming a first liner layer in the substrate surrounding the first deep trench;
 (f) filling the first deep trench with a first isolation material thereby forming a first deep trench isolation (DTI) feature in the substrate;
 (g) removing the spacer layer;
 (h) forming a second ISSG oxide layer over the sidewall of the first shallow trench;
 (i) forming a second liner layer in the substrate surrounding the first shallow trench; and
 (j) filling the first shallow trench with a second isolation material thereby forming a first shallow trench isolation (STI) feature in the substrate.

15. The method of claim 14, wherein the first shallow trench extends inwardly into the substrate with a first depth, and the first deep trench further prolongs the first shallow trench inwardly into the substrate with a second depth, the second depth being substantially greater than the first depth.

16. The method of claim 14, wherein the first DTI and STI features are formed in a pixel-array region of the substrate where one or more radiation-sensing devices are to be formed.

17. The method of claim 16, wherein the one or more radiation-sensing devices include a photodiode.

* * * * *